United States Patent
Chew

(10) Patent No.: US 7,158,601 B1
(45) Date of Patent: Jan. 2, 2007

(54) CLOCK DATA RECOVERY METHOD AND CIRCUIT FOR NETWORK COMMUNICATION

(75) Inventor: Chwei-Po Chew, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 763 days.

(21) Appl. No.: 10/282,498

(22) Filed: Oct. 28, 2002

(51) Int. Cl.
H03D 3/24 (2006.01)
H04L 23/00 (2006.01)

(52) U.S. Cl. ...................... 375/376; 375/377
(58) Field of Classification Search ........ 375/373–376, 375/222, 327, 354, 359, 360, 377; 372/141, 372/147, 156
See application file for complete search history.

(56) References Cited

U.S. PATENT DOCUMENTS

| | | | |
|---|---|---|---|
| 4,551,770 A * | 11/1985 | Palmer et al. .............. 386/113 |
| 5,276,716 A * | 1/1994 | Wincn ........................ 375/376 |
| 5,315,270 A * | 5/1994 | Leonowich ................. 331/1 A |
| 6,462,782 B1 * | 10/2002 | Honda et al. ............... 348/465 |
| 6,566,967 B1 * | 5/2003 | Anumula et al. ............ 331/11 |
| 6,721,380 B1 * | 4/2004 | Hairapetian et al. ....... 375/376 |
| 6,804,074 B1 * | 10/2004 | Shoji et al. .................. 360/51 |
| 6,987,817 B1 * | 1/2006 | Reuveni ..................... 375/340 |
| 2002/0018535 A1 * | 2/2002 | Hairpetian et al. ......... 375/376 |
| 2002/0061087 A1 * | 5/2002 | Williams .................... 375/376 |
| 2002/0131426 A1 * | 9/2002 | Amit et al. ................. 370/401 |
| 2003/0042985 A1 * | 3/2003 | Shibahara et al. ........... 331/17 |
| 2003/0210736 A1 * | 11/2003 | Yue ............................ 375/150 |
| 2005/0105662 A1 * | 5/2005 | Margules .................... 375/376 |

* cited by examiner

Primary Examiner—Tesfaldet Bocure

(57) ABSTRACT

Embodiments of the present invention relate to a method for recovering the clock and data signals in a transmitted data signal In a computer network. The method comprises accessing a transmitted a data signal at a receiver in the network, locking the receiver on a data signal transmission frequency, then locking the receiver on a data signal transition phase in the transmitted data signal and adjusting the signal transition phase locking by reference to the transition density of the transmitted data signal. Embodiments adjust the transition phase locking by adjusting the tail current of a Gm cell in a phase locked loop in the receiver, based on the received data signal transition density.

20 Claims, 9 Drawing Sheets

401  DATA  101010101010  100% DTD

402  PUMP-DOWN SIGNAL FOR 101010 DATA

403  DATA  110011001100  50% DTD

404  PUMP-DOWN SIGNAL FOR 11001100 DATA

CLOCK DATA RECOVERY METHOD AND CIRCUIT FOR NETWORK COMMUNICATION

FIELD OF THE INVENTION

Embodiments of the present invention relate to the field of computer network communications.

BACKGROUND OF THE INVENTION

Modern computer networks can communicate at very high data rates. Local Area Networks (LAN) and Wide Area Network (WAN) can transmit and receive hundreds of millions of bits per second over a single cable. Optically linked networks can communicate far faster, taxing the abilities of the even fastest processors.

Maintaining accurate reception of signals transmitted in high speed networks requires that extremely accurate clocks be in synchrony at each end of a communication. Because different transmitters and receivers are located at different distances away from each other, and the amount of time to travel any length of cable varies, received data clock "ticks' can drift away from a receiver's clock. Hence, clock signals are necessarily inherent in data signals.

Data transmission densities, the bit rates that are transmitted on any network cable, vary with data content, time, distance, hardware and other constraints. A receiver may have to adapt to data densities that can vary by a factor of 20 or more. Since a transition between high and low voltages is the readable feature in a data stream, data densities are best expressed as data transition density, or DTD.

There are processes in existence in which receivers can attempt to keep pace with changing DTDs. Such processes are known as Clock and Data Recovery or CDR.

CDRs can be required to receive input data whose average transition density, TD, can vary from five to one hundred percent of the maximum available rate. In other words, DTD, as well as the loop gain at the receiver, can vary by a factor of twenty. In a typical Phase-Locked Loop (PLL) CDR design, it is difficult to have Clock and Data Recovery meet the Synchronous Optical Network (SONET) jitter transfer specification with 20 times DTD, especially in light of variations in process, supply voltage and temperature, or PVT.

There are a number of ways by which solving this problem has been attempted. One way is to limit DTD variations in the input data or use external components to reduce PVT variations. Another one is to have loop gain compensated. Existing architectures use a counter to count VCO clock cycles between adjacent data transitions. The lower the DTD, the more clock cycles will be counted. The counter generates control voltages which adjust charge pump gain to compensate DTD variation.

In U.S. Pat. No. 5,315,270 issued May 24, 1994, to Leonowich, the loop gain of a phase locked loop is made to be controllably responsive to the transition density of an input data signal. In one embodiment a charge pump, positioned between the phase detector and the loop filter, supplies pulse-amplitude-modulated current pulses to the loop filter, the amplitude of pulses being related to the data transition density.

However, schemes such as that described in the cited patent cannot used with different linear phase detectors and are prone to lock into harmonics in the data stream. Further, they are necessarily higher speed devices and can generate high switching noise, implying high jitter, as well as consume higher power.

SUMMARY OF THE INVENTION

Accordingly, embodiments of the present invention are directed to a method and electronic system by which Clock and Data can be efficiently and reliably recovered. The method uses a novel technique of employing both data transition frequency detection and data transition phase detection to make for very reliable, accurate and low noise data reception.

Embodiments of the present invention relate to a method for recovering the clock and data signals in a transmitted data signal In a computer network. The method comprises accessing a transmitted data signal at a receiver in the network, locking the receiver on a data signal transmission frequency, then locking the receiver on a data signal transition phase in the transmitted data signal and adjusting the signal transition phase locking by reference to the transition density of the transmitted data signal. Embodiments adjust the transition phase locking by adjusting the tail current of a Gm cell in a phase locked loop in the receiver, based on the received data signal transition density.

By using the method presented in this embodiment of the present invention, CDR loop stability is improved. A direct benefit is jitter performance. The embodiment presents compensation in loop gain for input data transition density (DTD) variation. Therefore, loop stability is improved across various data transition density. The present invention allows a CDR loop to be used across various voltage-controlled oscillator (VCO) frequency rates, such as full rate and half rate.

The method presented in this embodiment of the present invention allows compensation in Gm cell tail currents by looking for average data transition density through a low pass filter (LPF). Embodiments of the present invention present both a method using data slicer outputs which are compared with average pump down signal voltage through operational amplifiers (OP-AMP), where the outputs from OP-AMP are used to switch Gm cell tail currents and also a method comparing the output of a pseudo Gm cell with a reference and providing the comparison to control Gm cell tail currents.

The methods presented in the embodiments of the present invention discussed herein reduce the risk of a CDR from locking onto a wrong frequency in the data stream. Further, by updating Gm cell tail currents slowly and by responding to average data transition density through a low pass filter, jitter in the PLL output is reduced. Lower speed circuits generally consume less power and provide lower switching noise in Gm cells. Lower noise implies better jitter performance.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The operation and components of this invention can be best visualized by reference to the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be understood by one of ordinary skill in the art that the present invention may be practiced without these specific details. In other instances, well-known methods, procedures, components, and circuits have not been described in detail so as not to unnecessarily obscure aspects of the present invention. At times, concepts disclosed in this discussion of embodiments of the present invention will be made more readily apparent by reference to the Figures.

Figure 1:
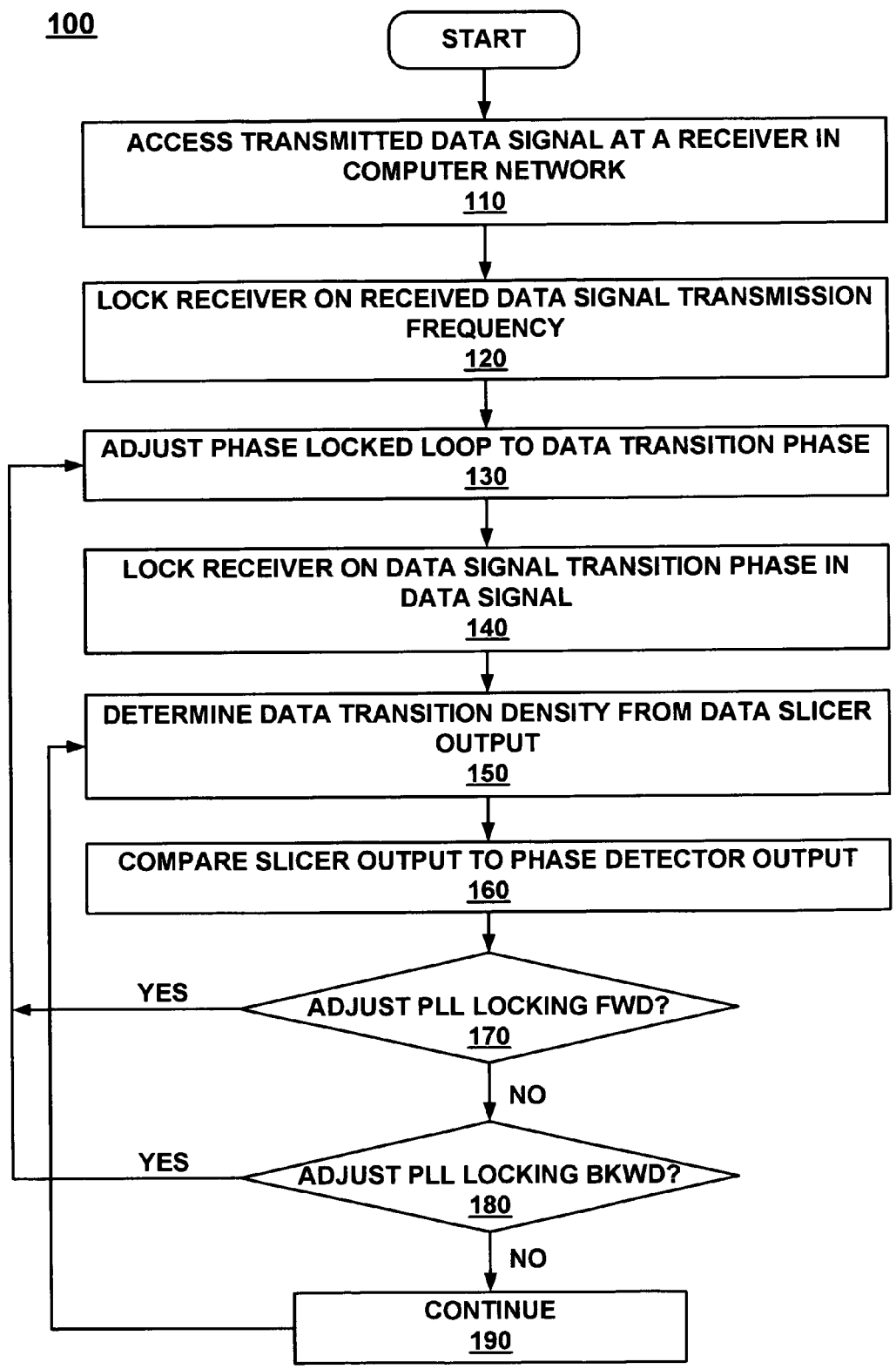
FIG. 1 illustrates a flow chart of one embodiment of the present invention.

FIG. 1 illustrates a flow chart representation of one embodiment of the present invention. Process 100 commences by accessing a transmitted data signal at a receiving device in a computer network, 110. It is noted that computer data communications comprise sequences and combinations of high and low voltages. Communications in a network comprise serial sequences of high and low voltages, recognized logically as "1" and "0". Because serial communications are time based, clock information is necessary. In step 110 of process 100, clock information and data, carried simultaneously, are both in the transmitted signal.

Using the output of a phase frequency detector to a phase-locked loop, the receiver locks on, 120, to the apparent frequency of the transmitted signal which can change with the density of data transition. It is noted that a data transition is a change from a high state to a low state or low state to high state. The composition of a data stream, as is discussed below, affects the apparent frequency by determining the rate or density of transitions in a given time frame. After locking on the frequency, the receiver then adjusts to phase locking, 130, based on the output of a phase detector, 140. Therefore, two loops are used.

As noted above, the data transition density (DTD) varies with the composition of data. Maintaining a lock on data transition phase requires monitoring of DTD which is accomplished, according to one embodiment, in a data slicer at 150. The data slicer output is compared to the phase detector output at 160 and adjustment to the PLL is made forward at 170 or backward at 180, as necessary. This operation continues as necessary at 190.

According to the above methods, the circuit first detects data density and uses this information to adjust the loop gain of a PLL. The loop gain may be controlled by altering the current supplied to the active loop filter. In one embodiment, higher data density translates into lower current and vice-versa. The data density detector, as described below, can be analog based.

The following descriptions illustrate circuit embodiments for the above clock and data recovery method.

Figure 2A:
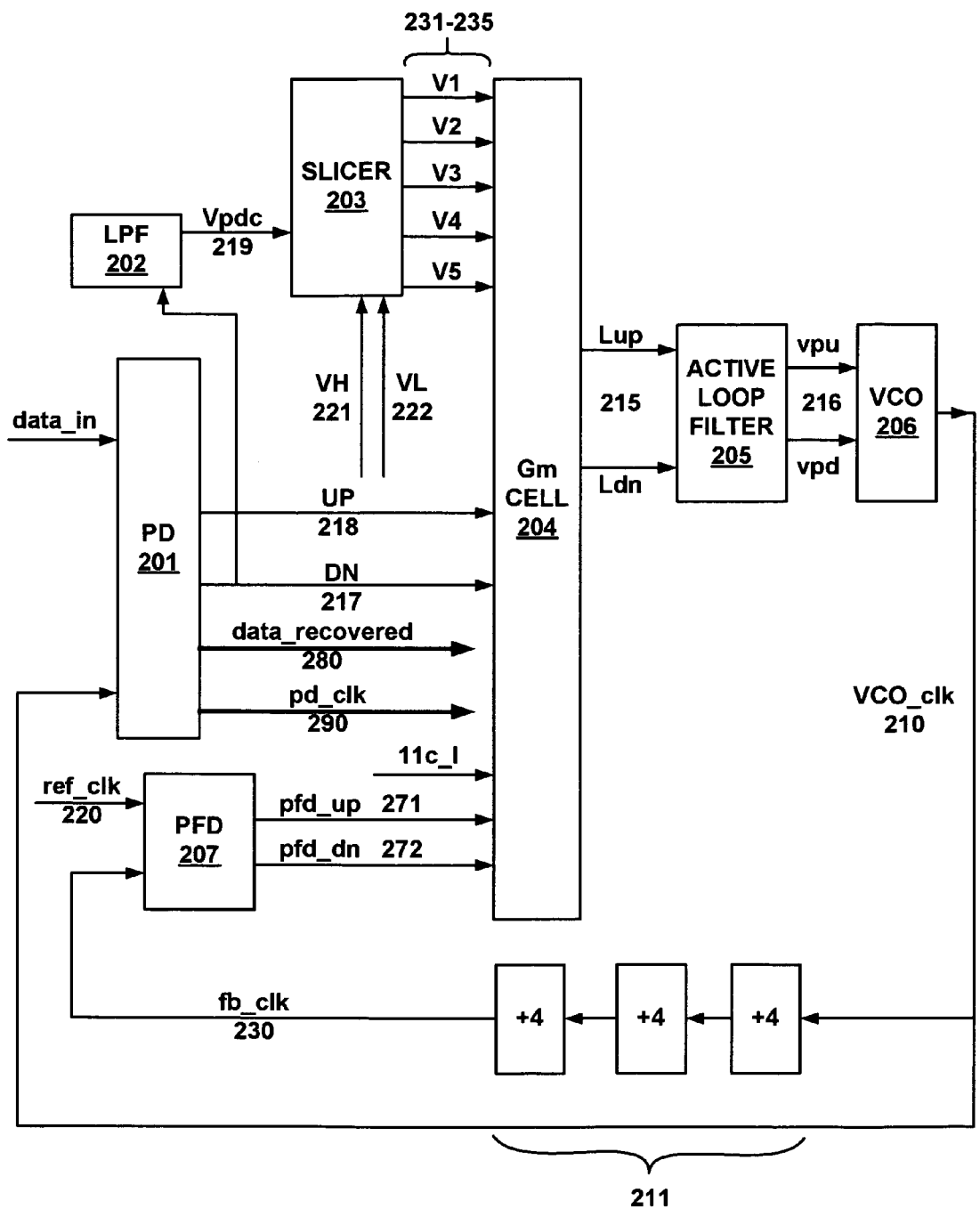
FIG. 2A illustrates a clock and data recovery circuit in accordance with an embodiment of the present invention.

FIG. 2A illustrates one implementation of an electronic clock and data recovery system that enables the process 100 outlined above in an embodiment of the present invention. FIG. 2A is exemplary as there are other physical implementations that accomplish the method. Phase Frequency Detector (PFD) 207 receives a clock reference which it compares with the phase-locked loop (PLL) output and sends up or down signals ("pfd_up", 271, and "pfd_dn", 272, respectively) to Gm cell 204 whose tail current, 215, controls the voltage output, 216, of active loop filter 205 which in turn controls the output of VCO 206.

As shown in this implementation, this embodiment of the Clock and Data Recovery (CDR) design is shown with PFD 207 in the PLL to enable frequency locking prior to phase locking. The PLL switches to phase detector feedback from PD 201 after the PFD 207 feedback pulls VCO 206 output frequency to within an acceptable range of the data frequency. Therefore, the data density is first detected then allowed to control the loop gain of the PLL. The dual loop design enabled by this implementation, and others that enable this embodiment of the present invention, can avoid possible "false locking" by dependency on PD feedback alone. The dual loop design compensates for DTD variation is using a low speed analog approach via low pass filter (LPF) 202, and data slicer 203. The density of pump-down pulses, shown as "DN" signal 217 represents data transition density (DTD). LPF 202 converts the pump-down signal 217 of the output of phase detector 201 into pseudo DC voltage (Vpdc) 219 which is proportional to average DTD. Vpdc 219 is compared with data slicer, 203, outputs to generate control voltages V1 through V5, shown at 220, which adjust the gain of Gm cell 204, which controls the loop gain of the PLL. The actual implementation of the comparator at slicer 203 can be a differential amplifier or other comparator circuit such as that illustrated in FIG. 2B.

Outputs of PD 201 provide the recovered clock and data signals. Data is recovered at 280, and the clock signal, "pd_clk" at 290 can also be extracted.

Figure 3A:
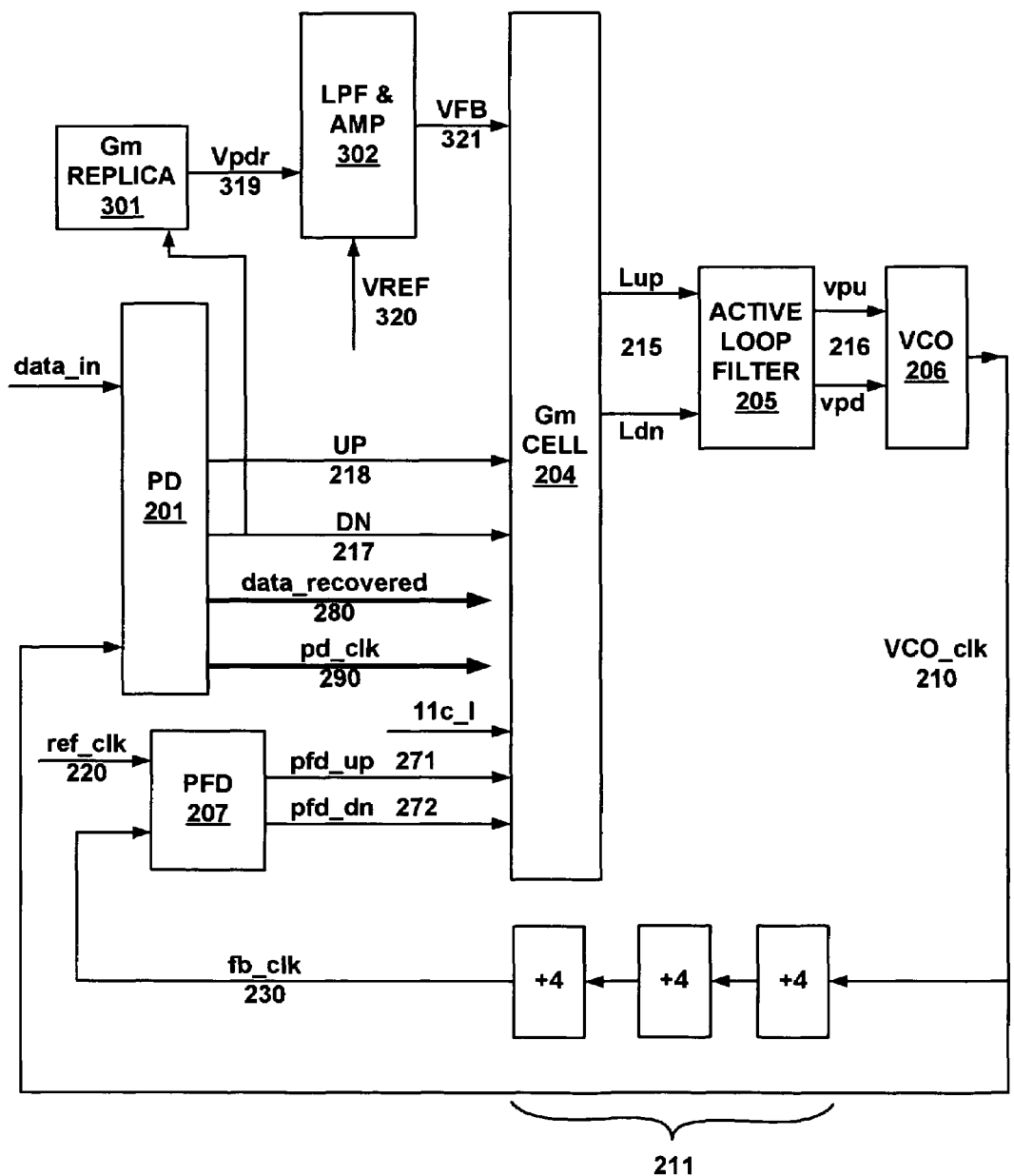
FIG. 3A illustrates a clock and data recovery circuit in accordance with an embodiment of the present invention.

It is noted here that the basic operation of a Phase/Frequency Detector (PFD) is to compare an incoming signal to a set reference signal. When the reference clock signal and VCO clock inputs are unequal in frequency and/or phase, the differential up and down outputs provide pulse streams which, when subtracted and integrated provide an error voltage for control of a VCO. In FIGS. 2A and 3A, PFD 207 accomplishes these functions with reference clock signal 220, feedback clock signal 230 which is a product, by process 211, of VCO output clock signal 210. PFD 207 outputs differential output signals 271 and 272 to Gm cell 204.

Figure 2B:
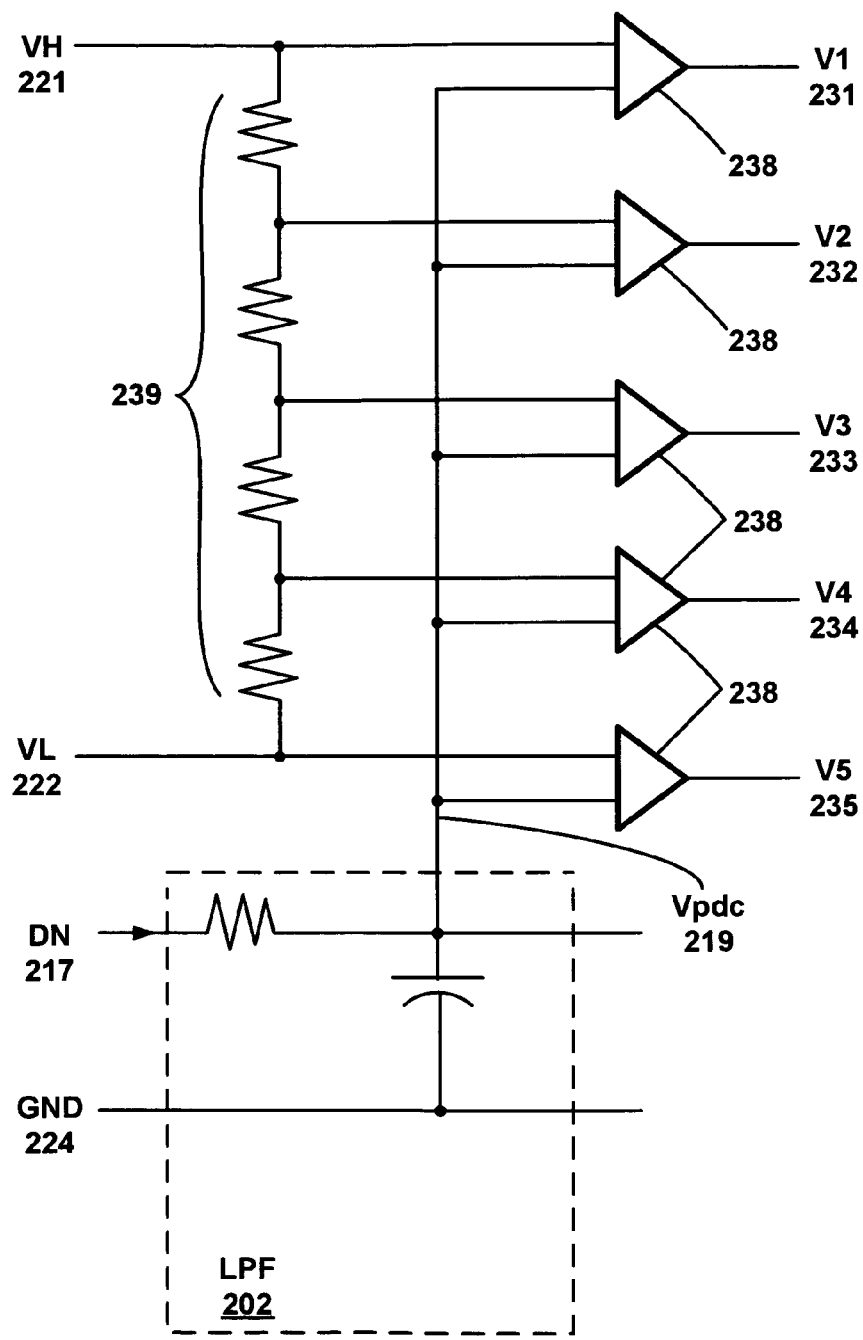
FIG. 2B illustrates an implementation of data slicer in accordance with an embodiment of the present invention.

FIG. 2B illustrates one implementation of an exemplary data slicer which can be implemented in any number of forms. Incoming Vpdc, 219, the output of LPF 202, is compared with five different voltage levels set by splitting resistors 239 between the high reference voltage VH, 221, and the low reference voltage VL, 222. This provides five separate and distinct control voltages to Gm cell 204. Data slicer output voltages V1 through V5, 231 through 235, can be binary weighted or equal weighted by proper sizing of resistor 239 values, as a given implementation requires.

Figure 2C:
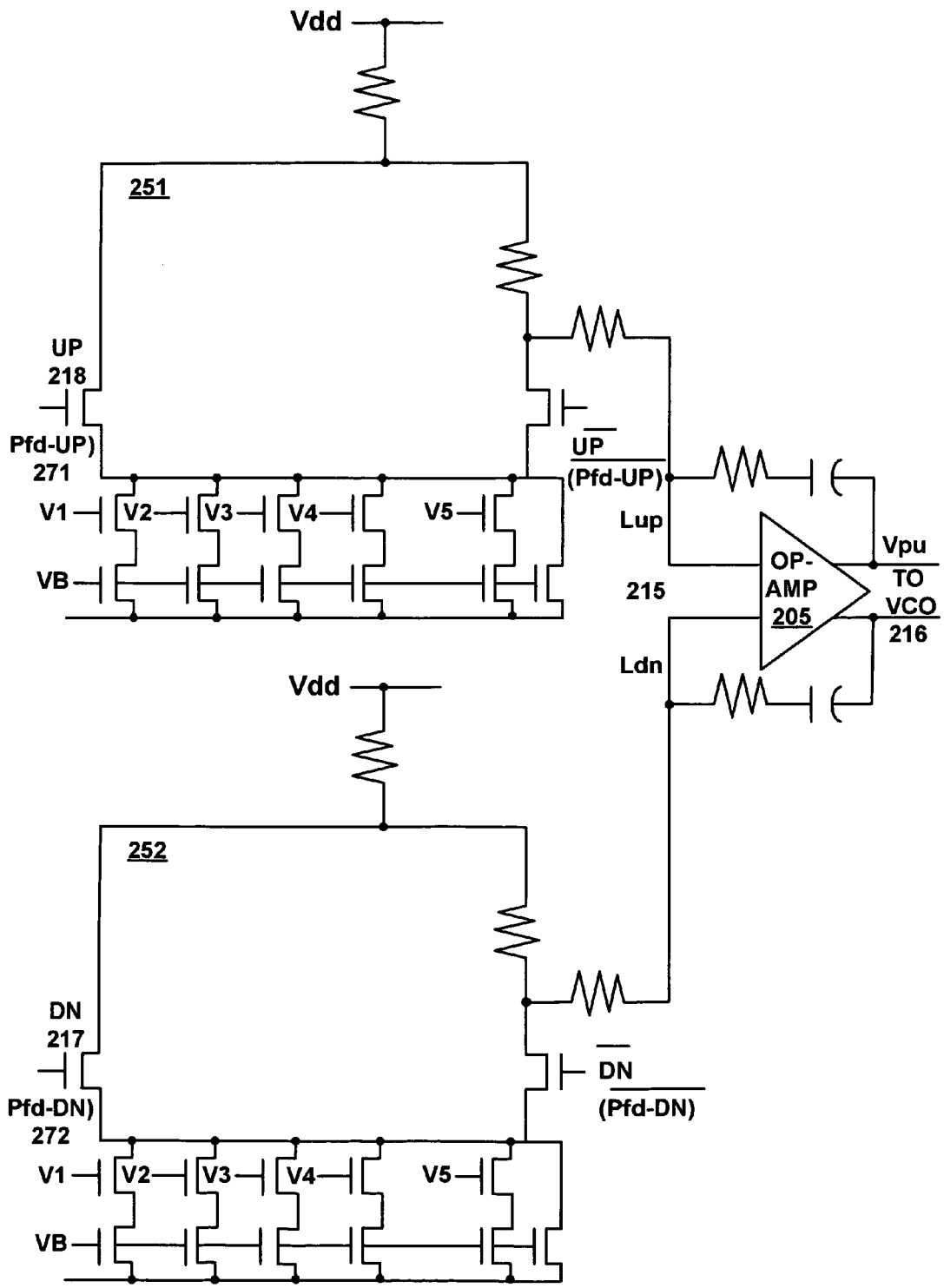
FIG. 2C illustrates an implementation of a Gm cell in accordance with an embodiment of the present invention.

FIG. 2C illustrates one implementation of an exemplary Gm Cell such as 204 of FIG. 2A. In FIG. 2C, a Gm cell is comprised of two Gm cell circuits, 251 and 252, generate pump-up and pump-down currents into an active filter, comprising op-amp 205, whose output controls the VCO frequency. The control voltages V1 through V5, derived from the comparator output such as that from data slicer 203 of FIG. 2B, controls Gm cell tail currents 215 in order to accomplish compensation in the loop gain for DTD variation. In order to keep the GM cell in continuous operation, a minimum tail current 215 is provided when slicer outputs V1 through V5 would switch tail currents off.

FIG. 3A illustrates an alternative implementation of a CDR design. For another embodiment of the present invention. Similar to the block diagram shown in FIG. 2A, the design in FIG. 3A differs in replacing LPF 202 and data slicer 203 with Gm replica cell 301 and LPF/Amp 302. In this design, replica tail current, Vpdr 319, is generated by replica Gm cell 301 by way of input pump down signal, 217. Vpdr 319 is filtered by the LPF in LPF/Amp 302 and compared with the desired DC level, Vref, 320, to generate control voltage output VFB 321. Any voltage difference between VREF 320 and Vpdr-dc is amplified as control signal VFB 321 and feedback to replica Gm cell 301 for adjusting replica Gm cell gain.

Figure 3B:
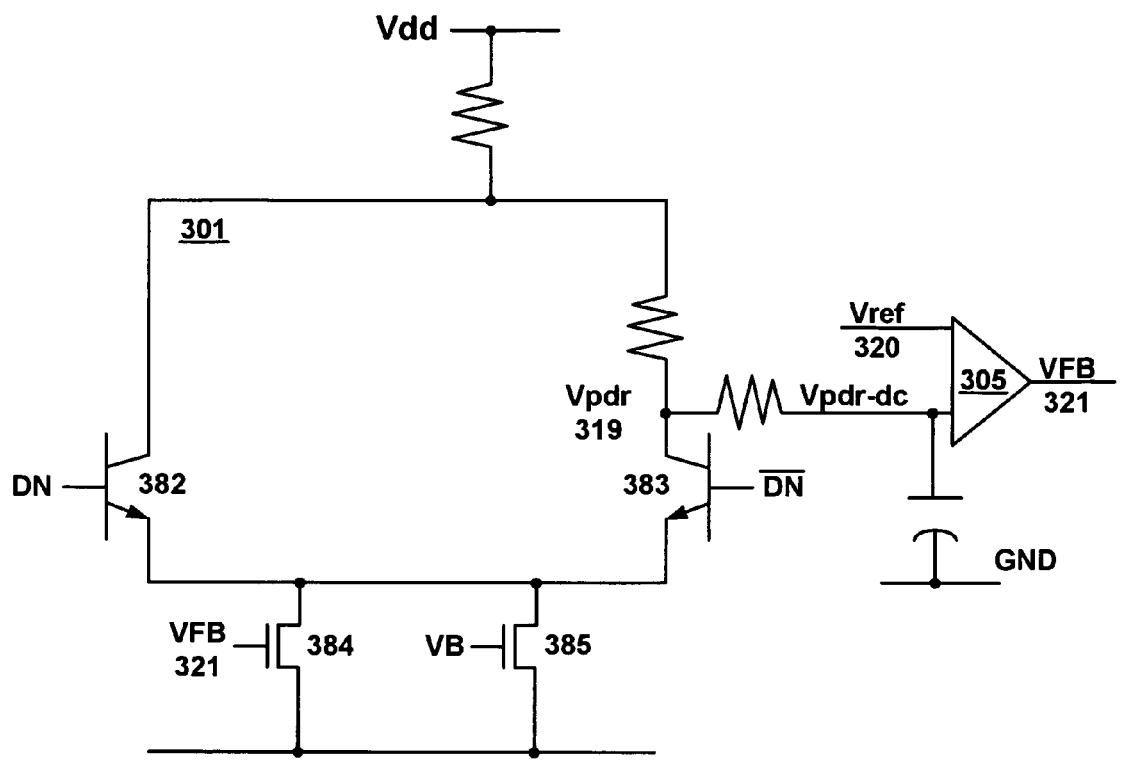
FIG. 3B illustrates an implementation of a Pseudo Gm cell in accordance with an embodiment of the present invention.

An implementation of an exemplary replica Gm cell is illustrated in FIG. 3B. Here, replica Gm cell 301 is implemented with transistors 382 and 383 as well as JFETs 384 and 385. Vpdr 319 is output to LPF/Amp 302 and, as discussed above, produces VFB 321 from the comparison of Vpdr-dc and Vref 320. It is noted that other implementations of a GM cell are also able to generate VFB 321 according to other embodiments of the present invention.

Figure 3C:
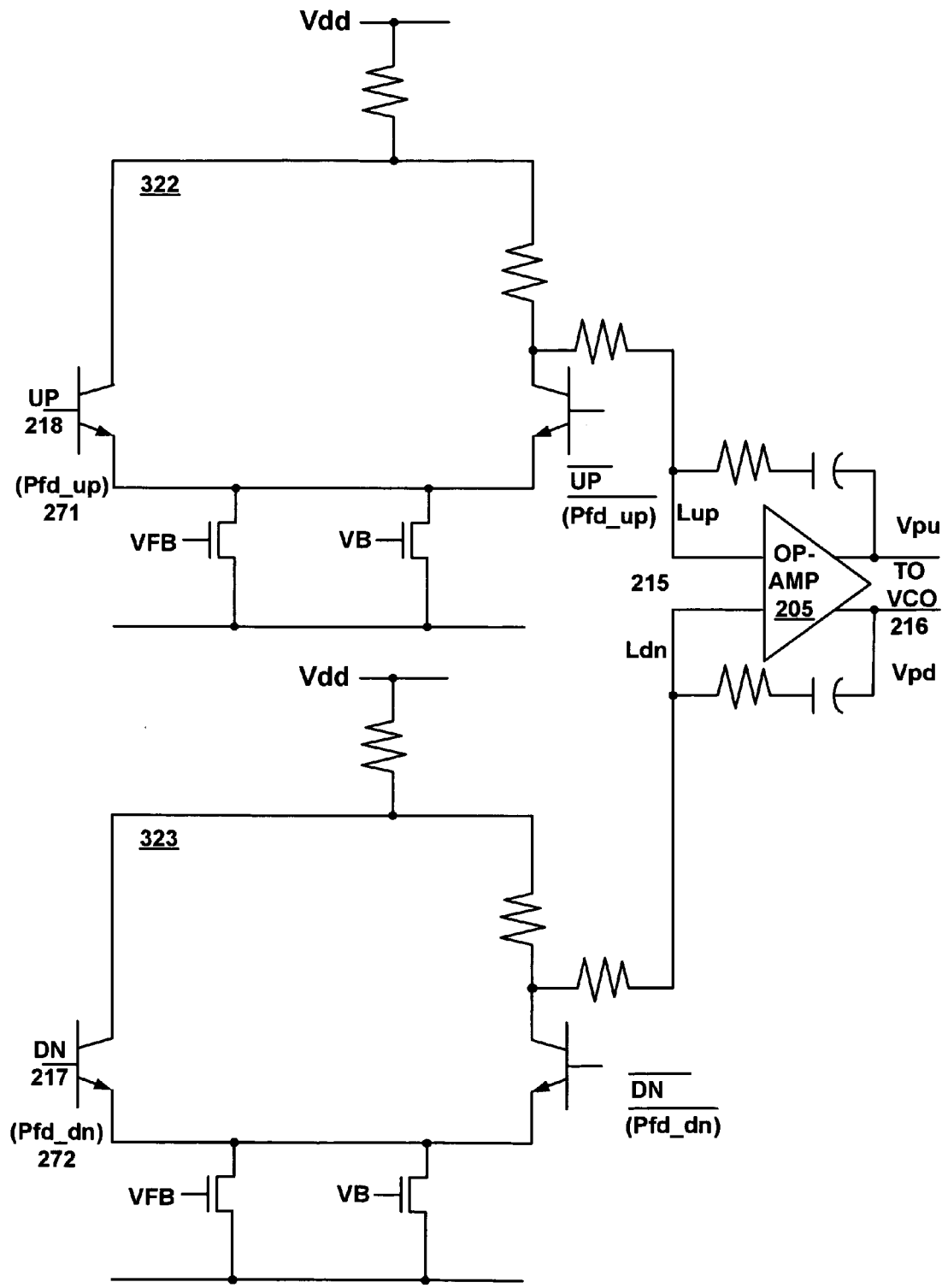
FIG. 3C illustrates an implementation of a Gm cell in accordance with an embodiment of the present invention.

FIG. 3C illustrates another implementation for Gm cell 204. As in other embodiments, Gm cell 204 accepts pump-up and pump-down signals, 218 and 217, from phase detector 201 and pfd-up and pfd-down signals, 271 and 272 from phase frequency detector 207, and produces tail current 215 for active loop filter 205, as is discussed above.

Figure 4:
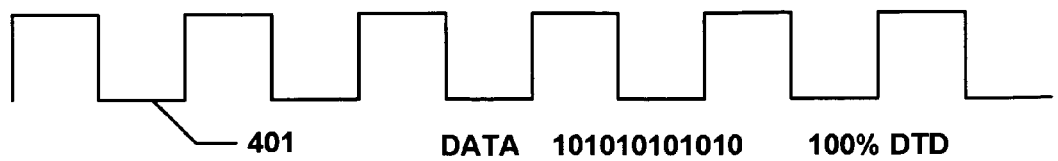
FIG. 4 illustrates exemplary data stream and pump-down signals in accordance with an embodiment of the present invention.
Figure 4:
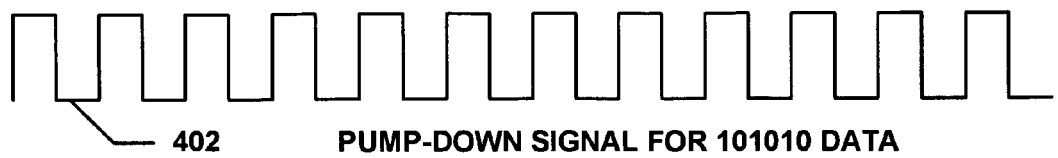
Figure 4:
Figure 4:
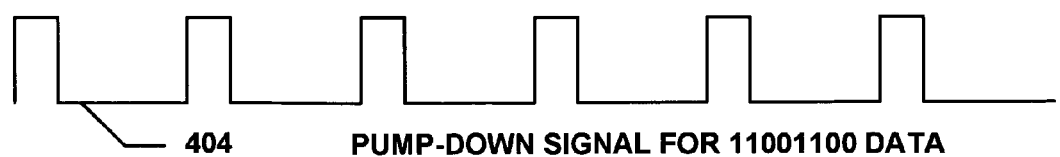

FIG. 4 contains timing diagrams to illustrate a data stream's signal levels. Data stream 401 illustrates a 100% data transition density (DTD) signal. Such a signal comprises a series of alternating highs and lows, e.g., 101010, where every clock pulse is accompanied by a transition between a high voltage and a low voltage. At 402, a pump-down voltage corresponding to a 100% DTD signal is shown. 402 represents the form that pump-down voltage 217 and 218 take in this situation. At 403, a 50% DTD signal is represented. A sequence of 11001100, etc, would provide exactly 50% DTD. 404 illustrates a pump-down voltage corresponding to the 50% DTD data signal. It is noted here that data signals assume many forms and are constantly changing. These data stream forms are offered for the sake of illustration only.

Figure 5:
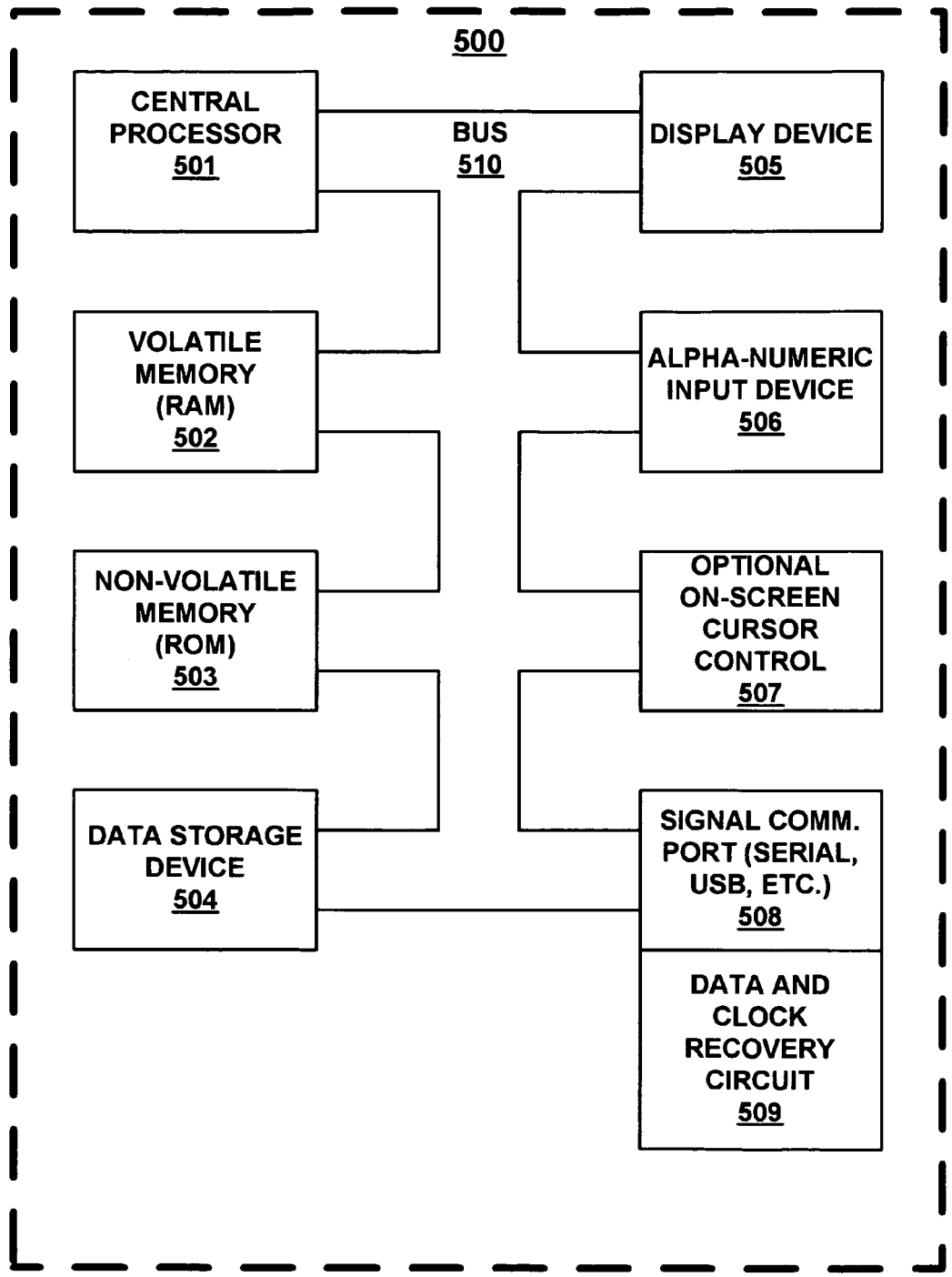
FIG. 5 illustrates an exemplary generic computer such as is used in accordance with an embodiment of the present invention.

An embodiment of the present invention discussed here may be implemented in a computer similar to the generic computer illustrated in FIG. 5. FIG. 5 illustrates, in block diagram form, a configuration typical to a computer system. In FIG. 5, computer system 500 comprises bus 510 which electronically connects central processor 501, volatile RAM 502, non-volatile ROM 503 and data storage device 504. Display device 505 is also connected to the bus though embodiments of the present invention can be used in servers without dedicated displays. Similarly connected are alpha-numeric input device 506, optional cursor control 507, and signal I/O device 508. Signal I/O device 508, containing in this embodiment the novel receiver with clock and data recovery circuits 509, can be implemented as a serial connection, USB, an infrared transceiver, an RF transceiver or any number of other communication protocols. It is noted that the location of CDR circuits may be anywhere suitable to their operation without affecting the functions described in these embodiments.

Some embodiments of the present invention have been shown an acceptable range of initial frequency locking of within +/− 200 ppm around the input data frequency but a specific range is not required herein. After the output clock frequency, 210, of VCO 206 is pulled into an acceptable range, PD 201 may lock onto data transition phases in varying data patterns. Once locked, the PLL can effect clock recovery, accepting any number of data patterns and associated varying DTD.

In some embodiments, VH, 221, and VL, 222, inputs to data slicer 203 can be programmed to better fit a particular application. Data slicer output voltages V1 through V5, 231–235, can be binary weighted or equal weighted by proper sizing the resistor values at 239. Similarly, VREF 320 can also be programmed according to the needs of an application.

The embodiments of the present invention allow the design to be re-used across various PD/VCO frequency rates (e.g. Full/Half rate). With the aid of frequency locking, there is no risk of the phase detector locking into the wrong frequency. Also Gm cell tail currents update slowly by responding to average data density through a low pass filter thereby consuming less power. Also, lower noise implies better jitter performance.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A method for recovering clock and data in a transmitted signal, comprising:
    accessing a transmitted data signal at a receiver;
    locking said receiver on a data signal transmission frequency in said transmitted data signal;
    locking said receiver on a data signal transition phase in said transmitted data signal; and
    adjusting said data signal transition phase locking by reference to a data transition density of said transmitted data signal.

2. The method described in claim 1, wherein said transmitted signal comprises clock information.

3. The method described in claim 2, wherein said transmitted signal further comprises data.

4. The method described in claim 1, wherein said locking on a data signal transmission frequency comprises sensing the output of a phase frequency detector.

5. The method described in claim 4, wherein said sensing the output of a phase frequency detector comprises sensing an average data transition density in a low pass filter.

6. The method described in claim 4, wherein said sensing the output of a phase frequency detector results in adjustment of a voltage controlled oscillator.

7. The method described in claim 1, wherein said locking on a data signal transition phase in said transmitted signal comprises sensing the output of a phase detector.

8. The method described in claim 7, wherein said sensing the output of a phase detector results in adjustment of a voltage controlled oscillator.

9. The method described in claim 1, wherein said adjusting said signal transition phase locking comprises adjusting the tail current of a Gm cell.

10. A circuit for recovering clock and data in a transmitted signal in a network, comprising:
   a receiver stage comprising a phase-locked loop circuit for receiving a transmitted data signal;
   a phase detector in said phase locked loop circuit coupled to a Gm cell in said phase locked loop circuit; and
   a phase frequency detector coupled to said Gm cell, wherein said phase locked loop circuit compensates for data density variation in said transmitted data signal by adjusting the loop gain in said phase locked loop circuit.

11. The circuit described in claim 10, wherein said phase-locked loop circuit comprises a data slicer coupled to said Gm cell in said phase-locked loop.

12. The circuit described in claim 11, wherein said data slicer senses the output of a low pass filter.

13. The circuit described in claim 12, wherein said low pass filter senses an average data transition density.

14. The circuit described in claim 10, wherein said phase-locked loop circuit comprises a replica Gm cell coupled to said Gm cell in said phase-locked loop and wherein further said loop gain is adjusted by controlling tail currents in said Gm cell.

15. The circuit described in claim 14, wherein said replica Gm cell provides a reference control voltage to said Gm cell.

16. The circuit described in claim 15 wherein said reference control voltage is averaged by a low pass filter.

17. A data clock recovery circuit, comprising:
   a data density detector sub-circuit for accessing an input signal and generating an output data signal and an output clock signal; and
   a phase-locked loop sub-circuit comprising an active loop filter, coupled with said data density detector sub-circuit in feedback, wherein said data density detector sub-circuit is enabled to control the loop gain of said phase-locked loop sub-circuit based on the data density of said input signal.

18. The data clock recovery circuit described in claim 17 wherein said data density detector sub-circuit comprises a low pass filter and a data slicer and wherein said low pass filter senses an average data transition density.

19. The data clock recovery circuit described in claim 17 wherein said data density detector sub-circuit comprises a replica Gm cell and an operational amplifier and wherein said replica Gm cell and said operational amplifier provide a control voltage to said Gm cell wherein said control voltage corresponds to an average data transition density.

20. The data clock recovery circuit described in claim 17 wherein said phase-locked loop sub-circuit further comprises a phase detector and a phase/frequency detector.

* * * * *